(12) United States Patent
Hwang et al.

(10) Patent No.: US 9,258,889 B2
(45) Date of Patent: Feb. 9, 2016

(54) CONDUCTIVE STRUCTURE, TOUCH PANEL, AND METHOD FOR MANUFACTURING SAME

(71) Applicant: LG Chem, Ltd., Seoul (KR)

(72) Inventors: Ji Young Hwang, Daejeon (KR); Min Choon Park, Daejeon (KR); Yong Goo Son, Daejeon (KR); Beom Mo Koo, Daejeon (KR)

(73) Assignee: LG CHEM, LTD., Seoul (KR)

( * ) Notice: Subject to any disclaimer, the term of this patent is extended or adjusted under 35 U.S.C. 154(b) by 0 days.

(21) Appl. No.: 14/560,862

(22) Filed: Dec. 4, 2014

(65) Prior Publication Data

US 2015/0085448 A1 Mar. 26, 2015

Related U.S. Application Data

(63) Continuation of application No. 14/008,245, filed as application No. PCT/KR2012/002284 on Mar. 28, 2012.

(30) Foreign Application Priority Data

Mar. 28, 2011 (KR) .......................... 10-2011-0027791

(51) Int. Cl.
| | |
|---|---|
| H05K 1/02 | (2006.01) |
| H05K 3/10 | (2006.01) |
| G06F 3/041 | (2006.01) |
| H05K 1/09 | (2006.01) |
| H05K 3/00 | (2006.01) |
| H05K 3/06 | (2006.01) |
| H05K 7/02 | (2006.01) |

(52) U.S. Cl.
CPC ............. *H05K 1/0274* (2013.01); *G06F 3/041* (2013.01); *H05K 1/09* (2013.01); *H05K 3/002* (2013.01); *H05K 3/06* (2013.01); *H05K 3/10* (2013.01); *H05K 7/02* (2013.01); *G06F 2203/04103* (2013.01); *H05K 2201/2054* (2013.01); *Y10T 29/49155* (2015.01)

(58) Field of Classification Search
CPC ........... H05K 1/09; H05K 1/05; H05K 1/053; H05K 1/056
See application file for complete search history.

(56) References Cited

U.S. PATENT DOCUMENTS

| | | | |
|---|---|---|---|
| 5,374,788 A * | 12/1994 | Endoh et al. ................... | 174/266 |
| 6,177,918 B1 | 1/2001 | Colgan et al. | |
| 2010/0013798 A1 | 1/2010 | Nakajima et al. | |
| 2011/0151215 A1 | 6/2011 | Kobayashi | |
| 2011/0279398 A1 * | 11/2011 | Philipp ......................... | 345/174 |

FOREIGN PATENT DOCUMENTS

JP 201027391 A 2/2010

* cited by examiner

*Primary Examiner* — Jeremy C Norris
(74) *Attorney, Agent, or Firm* — Dentons US LLP

(57) ABSTRACT

Provided are a conductive structure including a) a base, b) a conductive pattern provided on at least one side of the base, and c) a darkening layer provided on the upper surface and lower surface of the conductive pattern, provided on at least a part of the side of the conductive pattern, and provided in an area corresponding to the conductive pattern area, and a touch panel including the same and a manufacturing method thereof.

30 Claims, 7 Drawing Sheets

CONDUCTIVE STRUCTURE, TOUCH PANEL, AND METHOD FOR MANUFACTURING SAME

This application is a Continuation of U.S. patent application Ser. No. 14/008,245 filed Sep. 27, 2013, which is the National Phase of International Application No. PCT/KR2012/002284, filed Mar. 28, 2012, and claims the benefit of Korean Application No. 10-2011-0027791, filed on Mar. 28, 2011, all of which are hereby incorporated by reference in their entirety for all purposes as if fully set forth herein.

TECHNICAL FIELD

The application is based on and claims priority from Korean Patent Application No. 10-2011-0027791, filed on Mar. 28, 2011, with the Korean Patent Office, the disclosure of which is incorporated herein in its entirety by reference.

The present invention relates to a conductive structure, a touch panel and a method for manufacturing the same. The present invention relates to a conductive structure including a conductive pattern, a touch panel and a method for manufacturing the same.

BACKGROUND ART

In general, touch panels may be divided as follows according to a signal detecting method. That is, the touch panels are divided into a resistive type detecting a position pressed by a pressure through a change in a current or voltage value in a state where DC voltage is applied, a capacitive type using capacitance coupling in a state where AC voltage is applied, and an electromagnetic type detecting a selected position as a change in voltage in a state where a magnetic field is applied.

DETAILED DESCRIPTION OF THE INVENTION

Technical Problem

In the art, a technology development for improving performance of the aforementioned various types of touch panels has been required. In this case, to this end, in the case of using a metal minute line other than ITO in the related art, there is a problem in that a pattern is recognized due to high reflection of the metal.

Technical Solution

An exemplary embodiment of the present invention provides a conductive structure, including:
a) a base;
b) a conductive pattern provided on at least one side of the base; and
c) a darkening layer provided on the upper surface and the lower surface of the conductive pattern, provided on at least a part of the side of the conductive pattern, and provided in an area corresponding to the conductive pattern.

Further, another exemplary embodiment of the present invention provides a touch panel including the conductive structure.

Further, yet another exemplary embodiment of the present invention provides a display including the touch panel and a display module.

Still yet another exemplary embodiment of the present invention provides a manufacturing method of a touch panel, including:
forming a conductive pattern on a base; forming a darkening layer before and after forming the conductive pattern; and inducing Galvanic corrosion of the darkening layer.

Still yet another exemplary embodiment of the present invention provides a manufacturing method of a touch panel, including:
forming a conductive layer for forming a conductive pattern on a base; depositing a darkening layer before and after forming the conductive layer; patterning the conductive layer and the darkening layer separately or at the same time; and inducing Galvanic corrosion of the patterned darkening layer.

Advantageous Effects

According to the exemplary embodiments of the present invention, in a touch panel including a conductive pattern provided on an available screen part, a darkening layer is introduced on a visible side of the conductive pattern, such that it is possible to prevent reflection due to the conductive pattern without influencing conductivity of the conductive pattern, and a darkening layer is additionally introduced on the side of the visible side, such that it is possible to improve a darkening degree to improve concealment of the conductive pattern. Further, as describe above, by introduction of the darkening layer, it is possible to more improve a contrast characteristic of the touch panel.

BEST MODE

Figure 1:
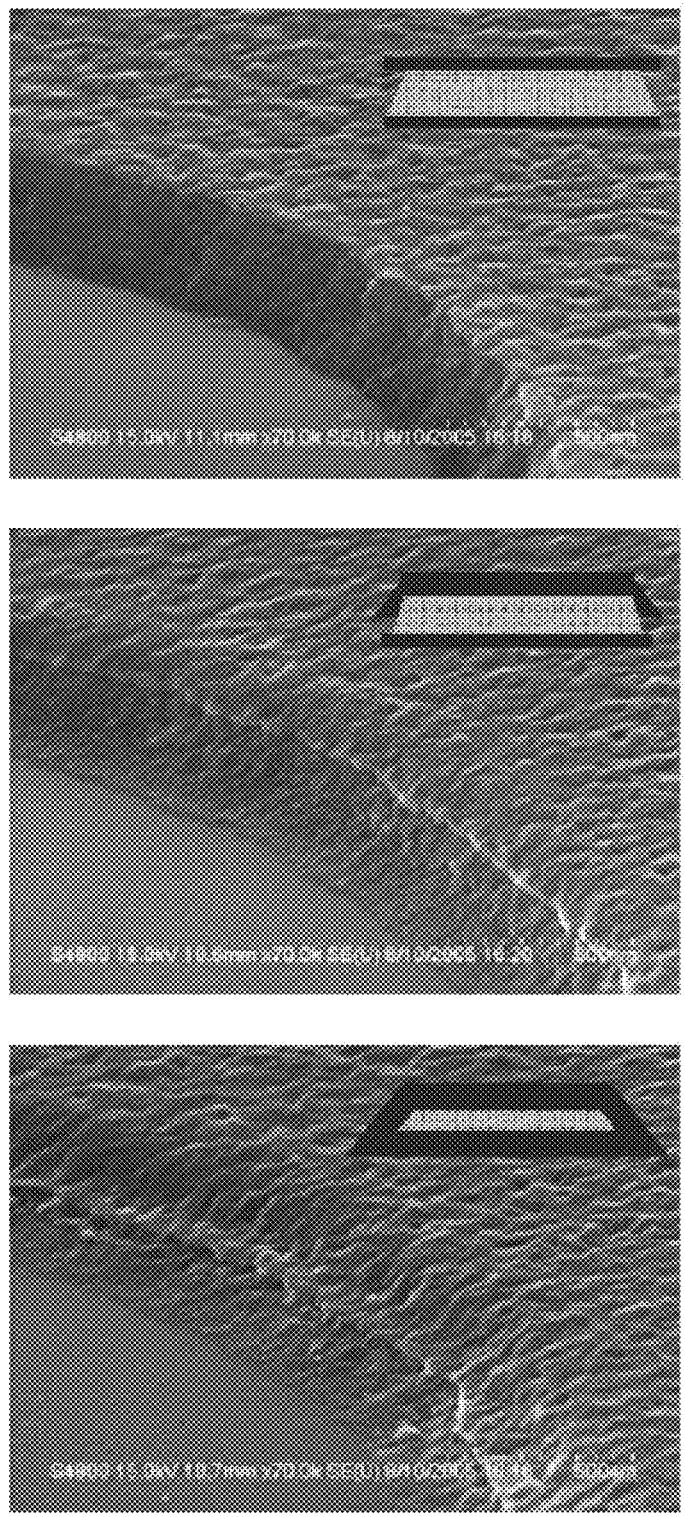
FIG. 1 is a diagram illustrating the case where a darkening layer is introduced to the side of a conductive pattern by using a Galvanic corrosion effect as an exemplary embodiment of the present invention.
Figure 2:
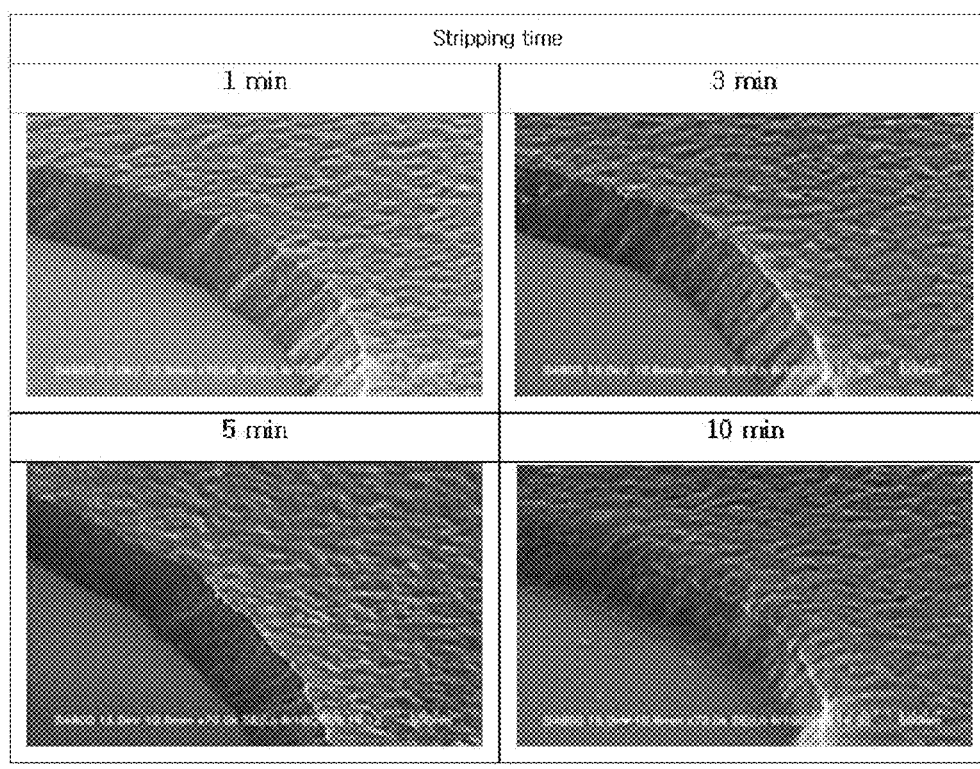
FIG. 2 is an electron micrograph of a conductive structure according to Example 1 as an exemplary embodiment of the present invention.
Figure 3:
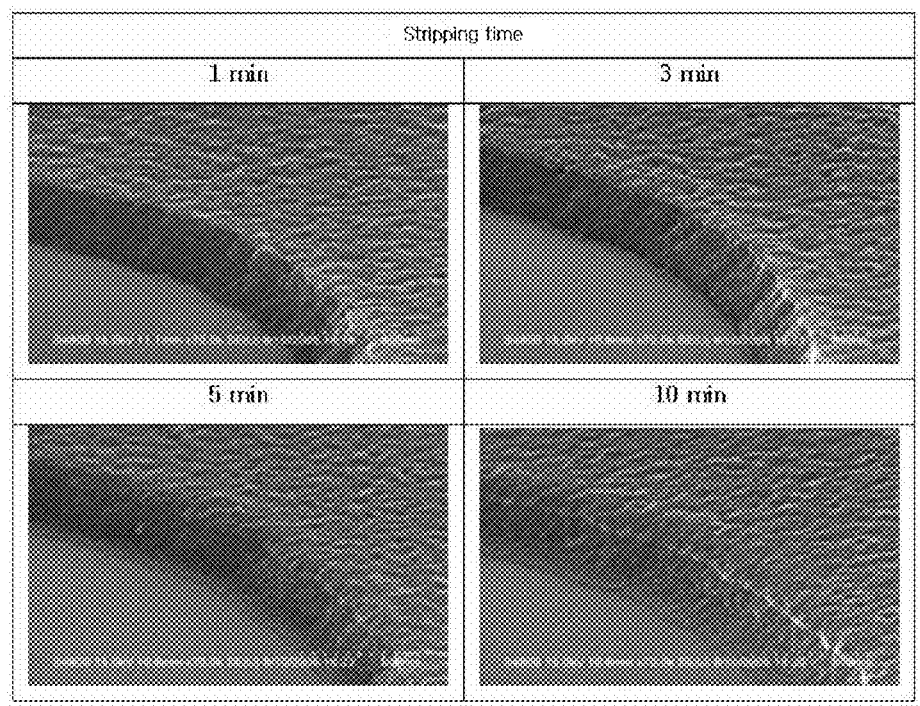
FIG. 3 is an electron micrograph of a conductive structure according to Example 2 as an exemplary embodiment of the present invention.
Figure 4:
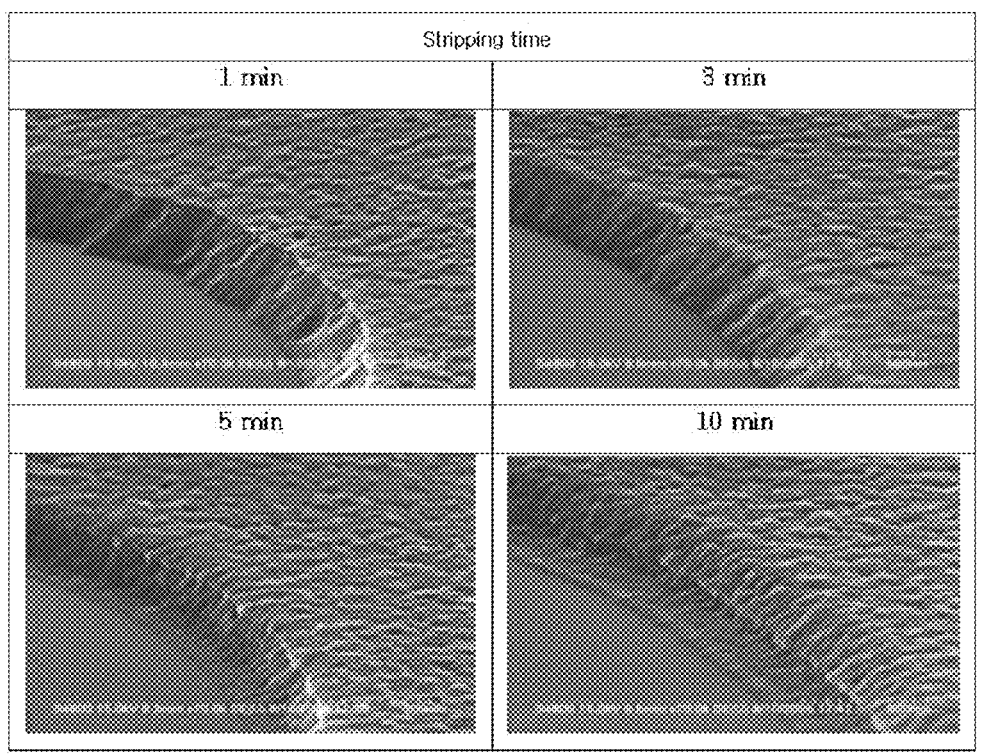
FIG. 4 is an electron micrograph of a conductive structure according to Example 3 as an exemplary embodiment of the present invention.
Figure 5:
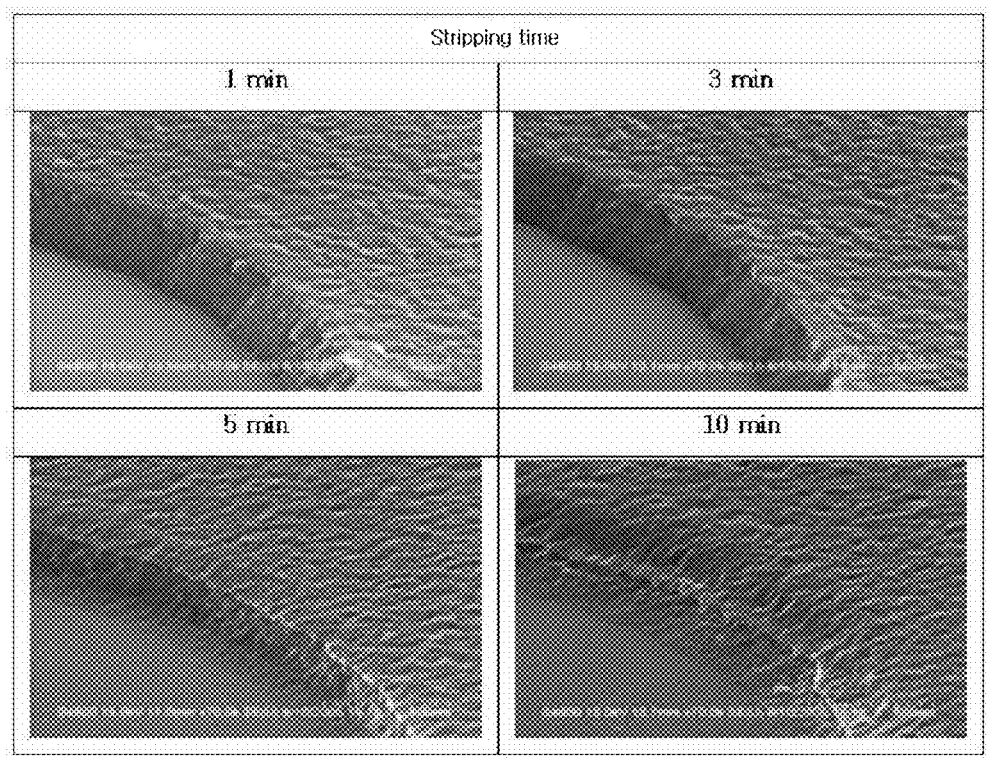
FIG. 5 is an electron micrograph of a conductive structure according to Example 4 as an exemplary embodiment of the present invention.

Hereinafter, the present invention will be described in detail.

In general, a touch panel uses an ITO based conductive layer, but when ITO is applied to a large-sized touch panel, there is a problem in that a recognition speed thereof is low due to RC delay itself. In order to solve the problem, an attempt to introduce an additional compensation chip has been made, but there is a problem in that costs increase. In order to solve the problem, a technology for replacing the ITO conductive layer by using a metal pattern is being developed in many manufacturers. However, the technology has disadvantages in that the pattern is recognized by human eyes well from the viewpoint of visibility due to high reflectivity of metal itself when a general single metal is used, and glare may occur due to high reflection and haze values and the like to external light.

As a result, the present inventors have performed researches capable of improving visibility of a conductive pattern and a reflective characteristic to external light in the touch panel including a conductive pattern provided on an available screen part, which is different from the touch panel using the ITO based conductive layer in the related art.

A conductive structure according to an exemplary embodiment of the present invention includes a) a base; b) a conductive pattern provided on at least one side of the base; and c) a darkening layer provided on the upper surface and lower surface of the conductive pattern, provided on at least a part of the side of the conductive pattern, and provided in an area corresponding to the conductive pattern area.

In the present invention, the darkening layer means a layer representing a characteristic in which a visible color is darkened due to the reflectivity and an absorption characteristic when metal forming the conductive layer is laminated with the darkening layer at the same time and a pattern configured therethrough, rather than means that a color or absorbance of the layer itself configuring the darkening layer represents black itself.

In the present invention, in the touch panel including the conductive pattern provided on the available screen part, it was found the fact that light reflection due to the conductive pattern had important influence on visibility of the conductive pattern, which was desired to be improved. In particular, in the ITO based touch panel in the related art, the problem due to the reflectivity of the conductive pattern is not very large because of high transmittance of the ITO itself, but in the touch panel including the conductive pattern provided on the available screen part, it was found the fact that the reflectivity and absorption characteristic of the conductive pattern had important influence on recognition of a line.

Accordingly, in the present invention, in order to lower the reflectivity of the conductive pattern and improve the absorbance characteristic in the touch panel, the darkening layer is introduced on the surface corresponding to the conductive pattern. In the present invention, the darkening layer is provided over the entire surface of the conductive pattern in the touch panel, thereby reducing visibility due to high reflectivity of the conductive pattern. In detail, since the darkening layer has destructive interference and self-absorption under a predetermined thickness condition when being coupled with the layer having high reflectivity such as the conductive pattern, by similarly adjusting the amount of light reflected by the darkening layer to the amount of light reflected by the conductive pattern though the darkening layer, and simultaneously, inducing inter-destructive interference between two lights under the predetermined thickness condition, the reflectivity is reduced by the conductive pattern. In this case, it is preferred that the darkening layer has lower reflectivity than the conductive pattern. As a result, since reflectivity of light may be lowered as compared with the case where a user directly views the conductive pattern, visibility of the conductive pattern may be largely reduced.

Particularly, in the present invention, the darkening layer may be provided on the entire surface including the upper surface, the lower surface, and the side surface of the conductive pattern. The darkening layer provided on the entire surface of the conductive pattern may be formed on the upper surface, lower surface, and side surface of the conductive pattern by inducing the darkening layer on the upper surface of the conductive pattern to cover the side of the conductive pattern by using a Galvanic corrosion effect shown between dissimilar metals according to a PH change due to DI mixing during over etching and striping processes which are additionally proceeded after introducing the darkening layer.

In this case, Galvanic corrosion means that when the dissimilar metals are immersed in a solution, a potential difference exists and as a result, movement of electrons occurs between the dissimilar metals, and in this case, a corrosion speed of the metal having a noble potential is decreased and a corrosion speed of the metal having an active potential is accelerated. That is, the metal having a noble potential is a negative electrode and the metal having an active potential is a positive electrode. As a result, the caused corrosion is referred to as Galvanic corrosion or dissimilar metal contact corrosion. One important factor influencing on Galvanic corrosion is an area ratio of the negative electrode and the positive electrode and as current density of a positive electrode area increases, the corrosion speed increases. On the contrary, combination of the negative electrode having a small area and the positive electrode having a large area is a good condition capable of reducing the Galvanic corrosion.

As an exemplary embodiment of the present invention, FIG. 1 shows an electron micrograph for each step in which the darkening layer is introduced to the side of a conductive pattern by using a Galvanic corrosion.

Considering that the corrosion effect of the surface and the side corrosion occur in a 0.5 µm level in a development generating area, the covering process of the side of the conductive pattern due to the Galvanic corrosion effect can be controlled in a state where a large change of an initial patterning line width is not caused. Further, in an aspect to the process, the covering process can be controlled by adjusting the content of an anticorrosive agent in a stripper, a DI mixing ratio in a stripper, stripping time and temperature, and the like.

From the aspect, the present invention has a large advantage in that the darkening layer can be introduced on the entire surface of the conductive pattern by controlling the stripping process without an additional process, and as a result, has a merit in that side reflection due to metal itself (particularly, high conductive metal) included in the conductive pattern can be controlled.

In an initial substrate material for forming the conductive structure according to the present invention, a color range of a pattern area formed with the darkening layer and the conductive pattern, which is measured from the side where the darkening layer of the conductive structure is viewed, may be a L value of 20 or less, an A value of −10 to 10, and a B value of −70 to 70 based on the CIE LAB color coordination, may be a L value of 10 or less, an A value of −5 to 5, and a B value of 0 to 35, and may be a L value of 5 or less, an A value of −2 to 2, and a B value of 0 to 15.

Further, the total reflectivity of the pattern area formed with the darkening layer and the conductive pattern, which is measured from the side where the darkening layer of the conductive structure is viewed, may be 17% or less, 10% or less, and 5% or less based on 550 nm.

Figure 6:
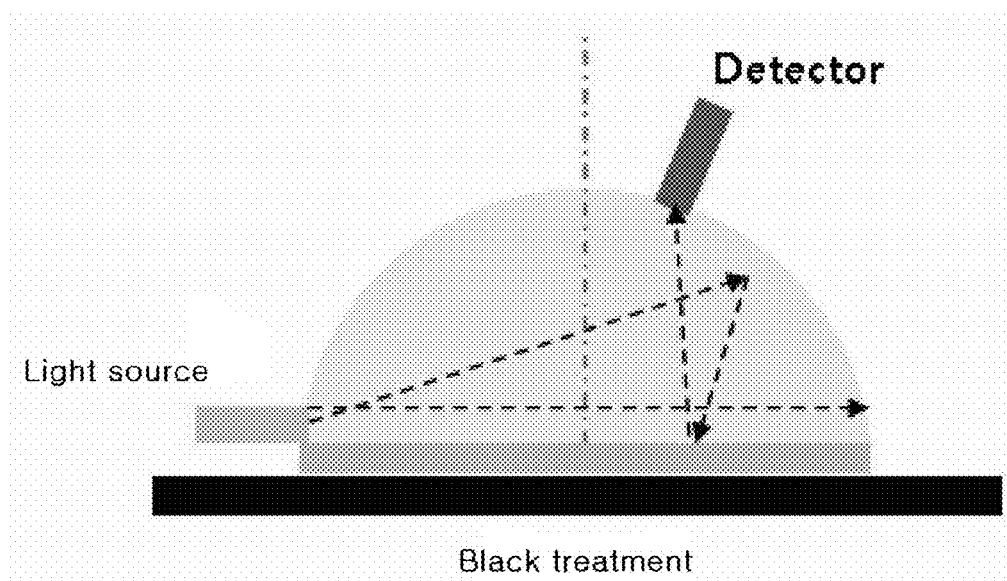
FIG. 6 is a diagram illustrating configuration and scheme of an apparatus for measuring reflectivity according to an exemplary embodiment of the present invention.

Herein, the total reflectivity is a value observed by measuring only the reflectivity of the surface to be measured after the reflectivity of an opposite surface of the surface to measure the reflectivity is made into 0 by using a black paste, a tape, or the like, and in this case, an inputted light source selected a diffuse light source most similar to an ambient light condition. Further, in this case, a measurement position of measuring the reflectivity was on the basis of a position inclined at about 7 degrees from a perpendicular line of an integrating sphere semicircle. The following FIG. 6 shows configuration and scheme of an apparatus for measuring the reflectivity as describe above.

As an exemplary embodiment of the present invention, in a touch panel manufactured by laminating two sheets of conductive structures forming a darkening layer and a conductive pattern through a patterning process by using an optically cleared adhesive (OCA) and then laminating the laminated conductive structures on tempered glass again, the total reflectivity measured at the base side may be 6% or less, 5% or less, and 4% or less in a reference sample of transmittance of 89%.

In this case, the transmittance and the total reflectivity have interrelation, in which as the transmittance is decreased, the total reflectivity is increased. Accordingly, a relationship between the transmittance and the total reflectivity of one sheet of base in a state where the pattern exists is illustrated by the following Equations 1 and 2.

$$\text{Transmittance of base} = \text{self-transmittance of base} \times (\text{opening area ratio}) \quad [\text{Equation 1}]$$

$$\text{Total reflectivity of base} = \text{self-reflectivity of base} \times (\text{opening area ratio}) + \text{self-total reflectivity of metal} \times (\text{closed area ratio due to metal line}) \quad [\text{Equation 2}]$$

In this case, the self-reflectivity of the base means reflectivity of base in a state where the metal minute line does not exist.

Further, a relationship to self-transmittance of the base is illustrated by the following Equation 3.

$$\text{Self-transmittance of base} = 100 - \text{self-reflectivity of base} - \text{self-absorptance of base} \quad [\text{Equation 3}]$$

Accordingly, the interrelationship between the total reflectivity and the transmittance in a state where the pattern exists is illustrated by the following Equation 4.

$$\text{Total reflectivity} = (100 - \text{self-transmittance of base} - \text{self-absorptance of base}) \times \text{opening area ratio} + \text{self-total reflectivity of metal} \times (\text{closed area ratio due to metal line}) \quad [\text{Equation 4}]$$

In this case, the sum of the opening area ratio and the closed area ratio is 1.

Accordingly, the Equation 4 may be represented by the following formula 5.

$$\text{Total reflectivity} = (100 - \text{self-transmittance of base} - \text{self-absorptance of base}) \times (\text{transmittance of base}/\text{self-transmittance of base}) + \text{self-total reflectivity of metal} \times (1 - \text{transmittance of base}/\text{self-transmittance of base}) \quad [\text{Equation 5}]$$

Accordingly, the total reflectivity and the transmittance of the base have a linear relationship in which the total reflectivity is decreased as the transmittance of base is increased.

The conductive structure according to the present invention means a multi-layered structure in which the base, the conductive pattern, and the darkening layer are sequentially deposited through a deposition process such as sputtering and the like. The conductive structure according to the present invention may be expressed by terms of a laminate, a multi-layered structure, and the like.

In the touch panel according to the present invention, the darkening layer includes a first surface bordered to the conductive pattern and a second surface facing the first surface, and when the total reflectivity of the conductive structure is measured at the second surface side of the darkening pattern, total reflectivity $Rt$ of the conductive structure may be calculated by the following Equation 6.

$$\text{Touch window total reflectivity } Rt \text{ using one sheet of base} = \text{touch tempered glass} + \text{reflectivity of bare base (reflectivity of a film in the case where the surface is the film)} \times \text{aperture ratio} + \text{reflectivity of darkening layer} \times \text{closed ratio} \quad [\text{Equation 6}]$$

Further, in the case where two kinds of conductive structures are laminated in the configuration of the touch panel, the total reflectivity $Rt$ of the conductive structure may be calculated by the following Equation 7.

$$\text{Total reflectivity } Rt = \text{touch tempered glass} + \text{reflectivity of laminate of two sheets of bare bases (reflectivity of a film in the case where the surface is the film)} \times \text{aperture ratio} + \text{closed ratio of laminate of two sheets of bases with pattern} \times \text{reflectivity of darkening layer} \times \text{closed ratio} \quad [\text{Equation 7}]$$

Accordingly, a difference between the case where the darkening layer exists and the case where the darkening layer does not exist depends on the reflectivity of the darkening layer, and in this aspect, the difference may be reduced by 15 to 20%, 20 to 30%, and 30 to 50% as compared with total reflectivity $R0$ of the conductive structure having the same configuration, except that the darkening layer does not exist. Actually, since even the darkening layer and the conductive pattern exist, the effect may also implement a product having lower reflectivity than a laminate using the bare base without any pattern and conductor. However, by the reduction effect, the reflectivity may be reduced by at least 15% up to 50% based on transmittance of 88% to the total reflectivity $R0$ of the conductive structure having the same configuration except that the darkening layer does not exist as described above.

In the touch panel according to the present invention, the darkening layer includes a first surface bounded on the conductive pattern and a second surface facing the first surface, and when the total reflectivity of the conductive structure is measured at the second surface side of the darkening pattern, a difference between the total reflectivity $Rt$ of the conductive structure and the total reflectivity $R0$ of the base may be 50% or less, 30% or less, 20% or less, and 10% or less.

In the touch panel according to the present invention, the touch panel further includes a substrate provided at one side of the conductive structure, and when total reflectivity of the substrate with the conductive structure is measured at the substrate side, a difference between the total reflectivity $Rt$ of the conductive structure and total reflectivity of the substrate may be 50% or less, 30% or less, 20% or less, and 10% or less.

Herein, the total reflectivity means self-total reflectivity of the touch panel including the darkening pattern.

In this specification, the total reflectivity is preferably a value measured based on a wavelength value of 550 nm among reflective lights which are reflected by a target layer or a laminate where light is inputted when incident light is 100%. The reason is because the total reflectivity of the wavelength of 550 nm is not largely different from the entire total reflectivity. For example, after a front darkening layer is formed with a material configuring the darkening layer on the base by using a method such as a deposition method, for example, a sputtering method, a chemical vapor deposition (CVD) method, a thermal evaporation method, an e-beam deposition method, and the like, reflectivity (550 nm) of visible light inputted from an air side may be measured. In this case, a darkening process is performed on the rear surface of the base, that is, the entire surface where the darkening layer is not formed, thereby removing reflection from the rear surface of the base. The base may use a transparent substrate, but is not particularly limited, and for example, may use glass, a plastic substrate, a plastic film, and the like.

In the touch panel according to the present invention, a haze value of the conductive structure may be 5% or less, 3% or less, and 1.5% or less.

The absorbance of the front layer made of the material configuring the darkening layer is not particularly limited, but may be 15% or less, 30% or less, and 40% or less.

Further, light transmittance of the front layer made of the material configuring the darkening layer is not particularly limited, but may be 80% or more so as to be used for the touch panel.

For example, the darkening layer may be formed by forming and patterning the darkening layer by using a method such as a deposition method, for example, a sputtering method, a chemical vapor deposition (CVD) method, a thermal evaporation method, an e-beam deposition method, and the like. Particularly, in the case of using the sputtering method, the darkening layer has an excellent flexible characteristic. In the thermal evaporation method and the e-beam deposition method, particles are simply stacked, but in the sputtering method, the particles form a nucleus due to collision and although the nucleus is grown to be bent, the nucleus has an excellent mechanical property. Particularly, in the case of using the sputtering method, an interface adhesion between the darkening layer and another layer is excellent. As described above, the darkening layer may be directly formed on the base or the conductive pattern without using an adhesive layer by using the deposition method, and desired thickness and pattern shape may be implemented.

In the present invention, the darkening layer and the conductive pattern may be simultaneously or separately patterned, but a layer for forming each pattern is separately formed. However, it is most preferred that the conductive pattern and the darkening layer are formed at the same time in order that the conductive pattern and the darkening layer exist on exactly the corresponding surface to each other.

As described above, while the effect of the darkening layer itself is optimized and maximized by forming the pattern, a fine conductive pattern required for the touch panel may be implemented. In the touch panel, in the case where the fine conductive pattern is not implemented, a physical property required for the touch panel such as resistance and the like may be not achieved.

In the present invention, in the darkening layer and the conductive pattern, a separate pattern layer has a laminated structure, which is different from a structure in which at least a part of an absorptive material is dented or dispersed in the conductive pattern, or a structure in which the surface of a single-layered conductive layer is treated to physically or chemically deform a part of the surface side.

Further, in the touch panel according to the present invention, the darkening layer is provided directly on the base or on the conductive pattern without interposing the adhesive layer. The adhesive layer may influence durability or an optical property. Further, the laminate included in the touch panel according to the present invention is manufactured by a manufacturing method which is entirely different from the case of using the adhesive layer. Furthermore, as compared with the case where the adhesive layer is used, in the present invention, an interface characteristic between the base or conductive pattern and the darkening layer is excellent.

In the present invention, if the thickness of the darkening layer has a destructive interference characteristic and an absorption coefficient characteristic which are the aforementioned physical properties, when a wavelength of light is defined by $\lambda$ and a refractive index of the darkening layer is defined by n, $\lambda/(4 \times n) = N$, if N satisfies an odd thickness condition, any thickness is irrelevant. However, in the case of considering an etching characteristic with the conductive pattern during the manufacturing process, the thickness is preferably selected between 10 nm and 400 nm, but a preferable thickness may be different according to a material and a manufacturing process and the scope of the present invention is not limited to the numerical range.

The darkening layer may also be formed in a single layer or a multi layer having two layers or more.

It is preferred that the darkening layer is close to an achromatic color. However, the darkening layer does not necessarily need the achromatic color, and may be used as long as the color has low reflectivity. In this case, the achromatic color means a color represented when light inputted into the surface of an object is not selectively absorbed but reflectively and evenly absorbed into a wavelength of each component. In the present invention, the darkening layer may use a material having a standard deviation of total reflectivity for each wavelength within 50% when the total reflectivity is measured in a visible light area 400 nm to 800 nm.

The material of the darkening layer is an absorptive material, and is not particularly limited and may be used as long as the material is a material made of metal, metal oxide, metal nitride or metal oxynitride having the aforementioned physical properties when the front layer is formed.

For example, the darkening layer may be an oxide layer, a nitride layer, an oxide-nitride layer, a carbide layer, a metal layer or a combination thereof according to a deposition condition set by those skilled in the art by using Ni, Mo, Ti, Cr, and the like. The present inventors verified that in the case of using Mo, the case where nitride is used at the same time has an optical characteristic more suitable for the darkening layer mentioned in the present invention, as compared with the case where oxide is singly used.

As a detailed example, the darkening layer may include both Ni and Mo. The darkening layer may include Ni of 50 to 98 atom % and Mo of 2 to 50 atom %, and may further include other metals, for example, atoms of Fe, Ta, Ti and the like in the amount of 0.01 to 10 atom %. Herein, the darkening layer may further include nitrogen of 0.01 to 30 atom % or oxygen or carbon of 4 atom % or less as necessary.

As another detailed example, the darkening layer may include a dielectric material selected from SiO, $SiO_2$, $MgF_2$ and SiNx (x is an integer of 1 or more) and a metal selected from Fe, Co, Ti, V, Al, Cu, Au and Ag, and may further include a metal alloy of two atoms or more selected from Fe, Co, Ti, V, Al, Cu, Au and Ag. The dielectric material is distributed so as to be gradually decreased as being far away from an inputted direction of external light, and the metal and the alloy component may be distributed in reverse. In this case, the content of the dielectric material may be 20 to 50 wt % and the content of the metal may be 50 to 80 wt %. In the case where the darkening layer further includes the alloy, the darkening layer may include the dielectric material of 10 to 30 wt %, the metal of 50 to 80 wt %, and the alloy of 5 to 40%.

As another detailed example, the darkening layer may be formed as a thin film including any one or more of an alloy of nickel and vanadium, oxide of nickel and vanadium, nitride or oxynitride. In this case, vanadium of 26 to 52 atom % may be contained and an atom ratio of vanadium to nickel may be 26/74 to 52/48.

As another detailed example, the darkening layer may include a transition layer having two or more atom, in which a composition ratio of one atom increases by about a maximum of 20% per 100 angstroms according to an incident direction of external light. In this case, one atom may be a metal atom such as chromium, tungsten, tantalum, titanium, iron, nickel or molybdenum, and an atom other than the metal atom may be oxygen, nitrogen or carbon.

As another detailed example, the darkening layer may include a first chromium oxide layer, a metal layer, a second chromium oxide layer, and a chromium mirror, and in this case, may include a metal selected from tungsten, vanadium, iron, chromium, molybdenum and niobium instead of chromium. The metal layer may have a thickness of 10 to 30 nm, the first chromium oxide layer may have a thickness of 35 to 41 nm, and the second chromium oxide layer may have a thickness of 37 to 42 nm.

As another detailed example, the darkening layer may use a laminated structure of an alumina ($Al_2O_3$) layer, a chromium oxide ($Cr_2O_3$) layer and a chromium (Cr) layer. Herein, the alumina layer has improvement of the reflection characteristic and an anti-light diffusion characteristic, and the chromium oxide layer may reduce reflectivity of a mirror surface to improve a contrast characteristic.

In the present invention, the darkening layer is provided in an area corresponding to the conductive pattern. Herein, the area corresponding to the conductive pattern means to have a pattern of the same shape as the conductive pattern. However, a pattern scale of the darkening layer does not need to be completely the same as the conductive pattern, and even the case where a line width of the darkening layer is smaller or larger than the line width of the conductive pattern is included in the scope of the present invention. For example, the darkening layer may have an area of 80% to 120% to an area with the conductive pattern.

The darkening layer may have a pattern form having the same line width as or a larger line width than the conductive pattern.

In the case where the darkening layer has the pattern form having the larger line width of the conductive pattern, when being viewed from a user, since an effect in which the darkening layer covers the conductive pattern is much largely applied, it is possible to efficiently block an effect due to gloss or reflection of the conductive pattern itself. However, although the line width of the darkening layer is the same as the line width of the conductive pattern, an effect desired by the present invention may be achieved. It is preferred that line width of the darkening layer has a larger width than the conductive pattern by a value calculated by the following Equation 8.

$$Tcon \times \text{tangent } \Theta_3 \times 2 \qquad \text{[Equation 8]}$$

In Equation 8,

Tcon is a thickness of the conductive pattern, $\Theta_3$ is an angle between light and a normal to the base surface, when the light inputted from a place where the user's sight is positioned transmits edges of the conductive pattern and the darkening layer.

$\Theta_3$ is an angle in which angle $\Theta_1$ between the user's sight and the base of the touch panel is changed according to Snell's law by a refractive index of the base and a refractive index of a medium of an area in which the darkening layer and the conductive pattern are disposed, for example, an adhesive of the touch panel.

As one example, assuming that a viewer views the conductive structure so that the $\Theta 3$ value forms an angle of about 80 degrees and the thickness of the conductive pattern is about 200 nm, the line width of the darkening layer is preferably larger by about 2.2 μm (200 nm×tan(80)×2) based on the side to the conductive pattern. However, as described above, even in the case where the darkening layer has the same line width as the conductive pattern, the effect desired by the present invention may be achieved.

In the present invention, the material of the base may be properly selected according to a field desired to apply the conductive structure according to the present invention, and as a preferable example, may be a glass or inorganic material substrate, a plastic substrate or film, or the like, but is not limited thereto.

The material of the conductive pattern is not particularly limited, but is preferably a metal. The material of the conductive pattern is a material having excellent conductivity and easily etchable. However, in the case of side darkening of the present invention, the conductive material may use different metal from the material of the darkening layer, and particularly, when considering the side darkening due to corrosion of the darkening layer, the conductive layer may be selected so as to have a noble potential (+ potential).

On the contrary, the case where the conductive layer has an active potential (− potential) is more advantageous in that an area of the darkening layer is widened due to the side corrosion, on the contrary to the case where the darkening layer forms an electrode having a wider area by using Galvanic corrosion.

In general, it is disadvantageous that the material having excellent conductivity has high reflectivity. However, in the present invention, in the case of using the darkening layer, the conductive pattern may be formed by using a material having high reflectivity. In the present invention, even in the case where a material having total reflectivity of 70 to 80% or more is used, the total reflectivity may be lowered through the darkening layer, visibility of the conductive pattern may be lowered, and the contrast characteristic may be maintained or improved.

As a detailed example of the material of the conductive pattern, a single layer or a multi layer including gold, silver, aluminum, copper, neodymium, molybdenum, nickel or an alloy thereof is preferable. Herein, the thickness of the conductive pattern is not particularly limited, but is preferably 0.01 to 10 μm or less from the viewpoint of conductivity of the conductive pattern and economic of the forming process.

Patterning of the laminate formed by the conductive layer and the darkening layer may use a method using an etching resist pattern. The etching resist pattern may be formed by using a printing method, a photography method, a method using a mask, a laser transfer method, for example, a thermal transfer imaging method, or the like and among them, the printing method or the photography method is more preferable. The conductive pattern is etched by using the etching resist pattern, and the etching resist pattern may be removed.

In the present invention, the line width of the conductive pattern may 10 μm or less, 0.1 to 1 μm, 0.2 to 8 μm, and 1 to 5 μm. The thickness of the conductive pattern may be 10 μm or less, 2 μm or less, and 10 to 300 nm.

The aperture ratio of the conductive pattern, that is, an area ratio which is not covered by the pattern may be 70% or more, 85% or more, and 95% or more. Further, the aperture ratio of the conductive pattern may be 90 to 99.9%, but is not limited thereto.

The conductive pattern may also be a regular pattern or an irregular pattern.

As the regular pattern, a pattern shape in the art such as a mesh pattern may be used. The irregular pattern is not particularly limited, but may also be a boundary shape of figures forming a Voronoi diagram. In the present invention, in the case of using the irregular pattern and the darkening layer together, a diffraction pattern of reflective light due to a directional illumination may be removed by the irregular pattern, and an effect due to scattering of light may be minimized by the darkening layer, thereby minimizing a problem on visibility.

In an exemplary embodiment of the present invention, the conductive pattern is the regular pattern and includes cross points formed by crossing any plurality of lines among lines configuring the conductive pattern, and the number of cross points may be 3,000 to 122, 500 in an area of 3.5 cm×3.5 cm, 13,611 to 30,625, and 19,600 to 30,625. Further, according to the exemplary embodiment of the present invention, in the case where the number of cross points is 4,000 to 123,000 when being attached to the display, it was verified that an optical characteristic without damaging an optical characteristic of the display is obtained.

Further, in the exemplary embodiment of the present invention, the conductive pattern is the irregular pattern and includes cross points formed by crossing any plurality of lines among lines configuring the conductive pattern, and the number of cross points may be 6,000 to 245,000 in an area of 3.5 cm×3.5 cm, 3,000 to 122,500, 13,611 to 30,625, and 19,600 to 30,625. Further, according to the exemplary embodiment of the present invention, in the case where the number of cross points is 4,000 to 123,000 when being attached to the display, it was verified that an optical characteristic without damaging an optical characteristic of the display is obtained.

The pitch of the conductive pattern may be 600 μm or less and 250 μm or less, but may be controlled according to transmittance and conductivity which those skilled in the art want.

The conductive pattern used in the present invention is preferably a material having specific resistance of $1 \times 10^6$ ohm·cm to $30 \times 10^6$ ohm·cm and more preferably $7 \times 10^6$ ohm·cm or less.

In the present invention, the conductive structure including the base, the conductive pattern, and the darkening layer may have surface resistance of 1 to 300 ohm/square. It is advantageous to operation of the touch panel within the range.

In the present invention, illuminance of the darkening layer may be 1 nm or more, 2 nm or more, 5 nm or more, and 10 nm or more, but is not limited thereto. Further, in the present invention, all the darkening layers provided on at least a part of the upper surface, the lower surface, and the side surface of the conductive pattern are the same material and may be subsequently connected to each other.

In the present invention, the sides of the darkening layer and the conductive pattern may have a forward tapered angle, but the darkening layer or the conductive pattern which is disposed on an opposite surface to the base side of the conductive pattern may have a reverse tapered angle.

The touch panel according to the present invention may further include a conductive structure including an additional darkening layer in addition to the conductive structure including the base, the conductive pattern and the darkening layer. In this case, the conductive structures including the darkening layer may be disposed in different directions based on the conductive pattern. The conductive structures including two or more darkening layers included in the touch panel of the present invention do not need to be the same structure, and any one thereof, preferably, only the conductive structure which is closest to the user may include the base, the conductive pattern and the darkening layer, and the additional conductive structure may not include the darkening layer.

Further, in the touch panel according to the present invention, the conductive pattern and the darkening layer may be provided on both sides of the base, respectively.

The total reflectivity in the touch panel including the conductive structure according to the present invention may be 12% or less, 7% or less, 5% or less, and 2% or less.

The touch panel according to the present invention may further include an electrode part or a pad part in addition to the available screen part with the conductive pattern on the conductive structure, and in this case, the available screen part and the electrode part/the pad part may be configured by the same conductor and have the same thickness so as not to have joints.

The touch panel according to the present invention may include a protective film, a polarization film, an anti-reflective film, an anti-glare film, an anti-fingerprinting film, a low reflective film, and the like on one surface of each base.

Further, the present invention provides a manufacturing method of a touch panel.

According to one exemplary embodiment, the present invention provides a manufacturing method of a touch panel including: forming a conductive pattern on a base; forming a darkening layer before and after forming the conductive pattern; and inducing Galvanic corrosion of the darkening layer.

According to another exemplary embodiment, the present invention provides a manufacturing method of a touch panel including: forming a conductive layer for forming a conductive pattern on a base; depositing a darkening layer before and after forming the conductive layer; patterning the conductive layer and the darkening layer separately or at the same time; and inducing Galvanic corrosion of the patterned darkening layer.

In the manufacturing methods, the material and the forming method of each layer as described above may be used.

Further, the touch panel according to the present invention includes the conductive structure. For example, in a capacitive touch panel, the conductive structure according an exemplary embodiment of the present invention may be used as a touch-sensitive electrode substrate.

The touch panel according an exemplary embodiment of the present invention may include a lower base; an upper base; and an electrode layer provided on any one surface or both surfaces of a surface bordered to an upper base of the lower base and a surface bordered to a lower base of the upper base. The electrode layer may perform a function of transmitting and receiving signals for detecting an X-axial position and a Y-axial position, respectively.

In this case, one or both of the electrode layer provided on the lower base and the surface bordered to the upper base of the lower base; and the electrode layer provided on the upper base and the surface bordered to the lower base of the upper base may be the conductive structure according to an exemplary embodiment of the present invention. In the case where only any one of the electrode layers is the conductive structure according to the present invention, the other electrode layer may have a pattern known in the art.

In the case where the electrode layers are provided on sides of the upper base and the lower base to form a two-layered electrode layer, an insulating layer or a spacer may be provided between the lower base and the upper base so that a gap between the electrode layers is uniformly maintained and the electrode layers are not connected to each other. The insulating layer may include an adhesive or a UV or thermal curing resin.

The touch panel may further include a ground part connected with the conductive pattern. For example, the ground part may be formed at an edge of the surface with the conductive pattern of the base. Further, at least one of the anti-reflective film, the polarization film, and the anti-fingerprinting film may be provided on at least one side of the laminate including the conductive structure. According to a design specification, different kinds of functional films in addition to the aforementioned functional films may further be included.

As described above, the touch panel may be applied to an OLED display Panel (ODP), a liquid crystal display (LCD), and display devices such as a cathode-ray tube (CRT) and an PDP. Further, the present invention provides a display including the touch panel and the display module.

BEST MODE

Hereinafter, the present invention will be described in more detail with reference to Examples. However, the following Examples just exemplify the present invention and the scope of the present invention is not limited to the following Examples.

EXAMPLE

Examples 1 to 4

A darkening layer was formed on a base by using Mo-based oxynitride and then a conductive layer was formed thereon by using Cu. Subsequently, a darkening layer was formed on the upper surface of the conductive layer by using Mo-based oxynitride and then progress of a covering effect due to Galvanic during a stripping process according to a DI mixing ratio and the content of an anticorrosive agent was observed. The results are shown in the following Tables 2 to 5.

TABLE 1

|  | DI mixing ratio (DI:Stripper) | Content of anticorrosive agent (wt %) |
| --- | --- | --- |
| Example 1 | 0.1:99.9 | 1.5 wt % |
| Example 2 | 0.1:99.9 | 1.0 wt % |
| Example 3 | 0.5:99.5 | 1.5 wt % |
| Example 4 | 0.5:99.5 | 1.0 wt % |

Example 5

A conductive layer and a darkening layer were formed by additionally forming oxynitride on the entire surface of a base where Cu is deposited by using a Mo target with sputter equipment and finally, the thickness of a laminate was 220 nm. Reflectivity of the base measured at the darkening surface was 6.1%. An etching resist (self-developed by LGC) was printed on the formed base by using a reverse offset process and then fired at 120° C. for 3 minutes, and etched at 40° C. for 40 seconds by using a Cu etchant manufactured by ENF Co., Ltd. Thereafter, a line width of the formed pattern measured after releasing with acetone was 3.5 μm. Two sheets of manufactured conductive substrates were laminated with OCA (3M 50 μm) and then laminated on Gollia glass of 0.55 t manufactured by Samsung Corning Co., Ltd. with OCA of 100 μm, and total reflectivity was measured.

Example 6

A conductive layer and a darkening layer were formed by additionally forming oxynitride on the entire surface of a base where Cu is deposited by using a Mo target with sputter equipment and finally, the thickness of a laminate was 220 nm. Reflectivity of the base measured at the darkening surface was 6.1%. An etching resist (self-developed by LGC) was printed on the formed base by using a reverse offset process and then fired at 120° C. for 3 minutes, and etched at 40° C. for 40 seconds by using a Cu etchant manufactured by ENF Co., Ltd. Thereafter, after Amine (amino ethoxy ethanol) and NMP were mixed by a ratio of 2:8 and then the solution and DI were mixed by a ratio of 99.5:0.5, released at 60° C. for 10 minutes, the measured line width of the formed pattern was 3.6 μm. Two sheets of manufactured conductive substrates were laminated with OCA (3M 50 μm) and then laminated on Gollia glass of 0.55 t manufactured by Samsung Corning Co., Ltd. with OCA of 100 μm, and total reflectivity was measured.

Comparative Example 1

Two sheets of Bare PET substrates were laminated with OCA (3M 50 μm) and then laminated on Gollia glass of 0.55 t manufactured by Samsung Corning Co., Ltd. with OCA of 100 μm, and total reflectivity was measured.

Comparative Example 2

An etching resist (self-developed by LGC) was printed on the conductive substrate (100 μm PET) made of Al: the formed base by using a reverse offset process and then fired at 120° C. for 3 minutes, and etched at 40° C. for 40 seconds by using an Al etchant manufactured by EXAX Co., Ltd. Thereafter, a line width of the formed pattern measured after releasing with acetone was 3.5 μm. Two sheets of manufactured conductive substrates were laminated with OCA (3M 50 μm) and then laminated on Gollia glass of 0.55 t manufactured by Samsung Corning Co., Ltd. with OCA of 100 μm, and total reflectivity was measured.

Figure 7:
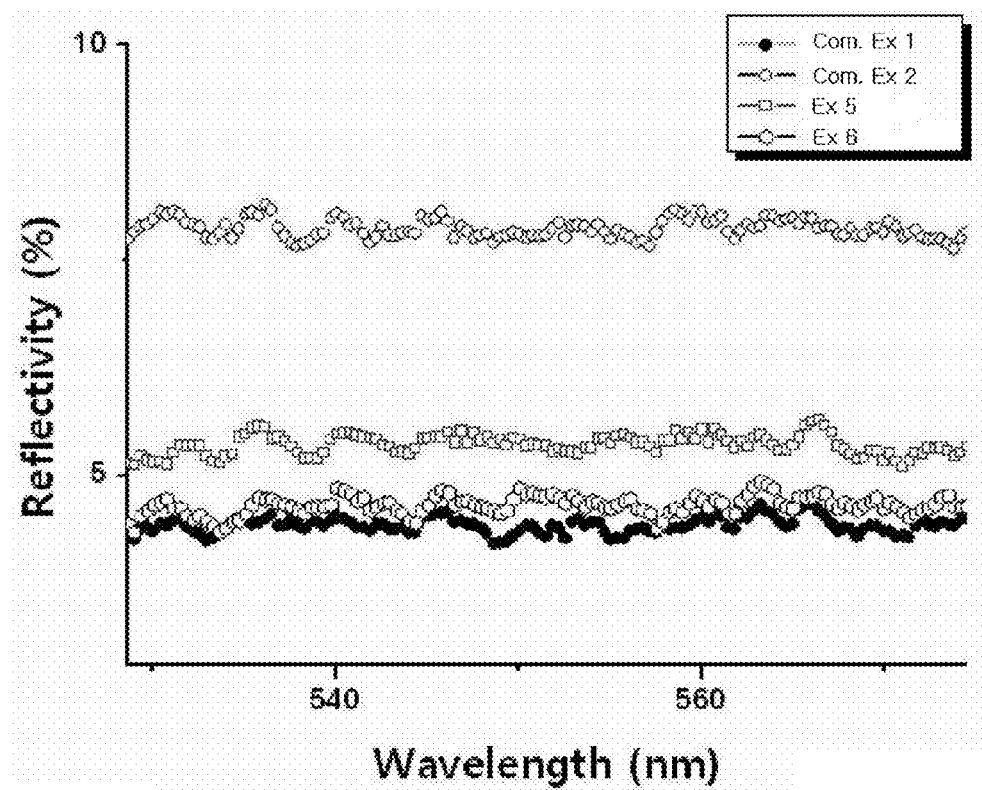
FIG. 7 is a diagram illustrating a result of total reflectivity of Examples 5 and 6 and Comparative Examples 1 and 2 as an exemplary embodiment of the present invention.

The results of total reflection of Examples 5 and 6 and Comparative Examples 1 and 2 were shown in the following FIG. 7.

From the result, the darkening layer can be introduced on the entire surface of the conductive pattern by controlling the stripping process without an additional process, and as a result, side reflection due to the metal included in the conductive pattern can be controlled.

The invention claimed is:

1. A conductive structure, comprising:
   a) a base;
   b) a conductive pattern provided on at least one side of the base; and
   c) a darkening layer provided on the upper surface and the lower surface of the conductive pattern, provided on at least a part of the side of the conductive pattern, and provided in an area corresponding to the conductive pattern,
   wherein the base is glass, a plastic substrate or a plastic film.

2. The conductive structure of claim 1, wherein a color range of a pattern area configured by the darkening layer and the conductive pattern, which is measured at the surface where the darkening layer of the conductive substrate is viewed, has a L value of 20 or less, an A value of −10 to 10, and a B value of −70 to 70 based on the CIE LAB color coordination.

3. The conductive structure of claim 1, wherein total reflectivity in the pattern area configured by the darkening layer and the conductive pattern, which is measured at the surface where the darkening layer of the conductive substrate is viewed, is 17% or less based on 550 nm.

4. The conductive structure of claim 1, wherein the darkening layer includes one kind or more selected from a group constituted by a dielectric material, a metal, a metal alloy, a metal oxide, a metal nitride, a metal oxynitride, and a metal carbide.

5. The conductive structure of claim 4, wherein the metal includes one kind or more selected from a group constituted by Ni, Mo, Ti, Cr, Al, Cu, Fe, Co, Ti, V, Au and Ag.

6. The conductive structure of claim 1, wherein total reflectivity in the surface where the darkening layer of the conductive substrate is viewed, is reduced by 15 to 50% as compared with the total reflectivity of the conductive structure having the same configuration except that the darkening layer is not included.

7. The conductive structure of claim 1, wherein a haze value of the conductive structure is 5% or less.

8. The conductive structure of claim 1, further comprising:
a second conductive structure including a base, a conductive pattern provided on at least one side of the base, and a darkening layer provided on the upper surface and lower surface of the conductive pattern, provided on at least a part of the side of the conductive pattern, and provided in an area corresponding to the conductive pattern area.

9. The conductive structure of claim 8, wherein an insulating layer is provided between the two conductive structures.

10. The conductive structure of claim 8, wherein the two conductive structures are disposed in opposite directions or in the same direction.

11. The conductive structure of claim 1, wherein the conductive pattern and the darkening layer are provided on both sided of the base, respectively.

12. The conductive structure of claim 1, wherein the conductive pattern is a regular pattern or an irregular pattern.

13. The conductive structure of claim 1, wherein the conductive pattern is the regular pattern and includes cross points formed by crossing any plurality of lines among lines configuring the conductive pattern, and the number of cross points is 3,000 to 122,500 in an area of 3.5 cm×3.5 cm.

14. The conductive structure of claim 13, wherein the number of cross points is 13,611 to 30,625 in an area of 3.5 cm×3.5 cm.

15. The conductive structure of claim 1, wherein the conductive pattern is the irregular pattern and includes cross points formed by crossing any plurality of lines among lines configuring the conductive pattern, and the number of cross points is 6,000 to 245,500 in an area of 3.5 cm×3.5 cm.

16. The conductive structure of claim 15, wherein the number of cross points is 13,611 to 30,625 in an area of 3.5 cm×3.5 cm.

17. The conductive structure of claim 1, wherein the darkening layer has a pattern form having the same line width as or larger line width than the conductive pattern.

18. The conductive structure of claim 1, wherein the line width of the conductive pattern is 10 μm or less, the thickness is 10 μm or less, and the pitch is 600 μm or less.

19. The conductive structure of claim 1, wherein the line width of the conductive pattern is 7 μm or less, the thickness is 1 μm or less, and the pitch is 400 μm or less.

20. The conductive structure of claim 1, wherein the line width of the conductive pattern is 5 μm or less, the thickness is 0.5 μm or less, and the pitch is 300 μm or less.

21. The conductive structure of claim 1, wherein illuminance of the darkening layer is 1 nm or more.

22. The conductive structure of claim 1, wherein illuminance of the darkening layer is 2 nm or more.

23. The conductive structure of claim 1, wherein illuminance of the darkening layer is 5 nm or more.

24. The conductive structure of claim 1, wherein illuminance of the darkening layer is 10 nm or more.

25. The conductive structure of claim 1, wherein all the darkening layers provided on at least a part of the upper surface, the lower surface, and the side surface of the conductive pattern are the same material and subsequently connected to each other.

26. A touch panel including the conductive structure of claim 1.

27. A display including the touch panel of claim 26 and a display module.

28. A manufacturing method of a touch panel, comprising:
forming a conductive pattern on a base;
forming a darkening layer before and after forming the conductive pattern; and
inducing Galvanic corrosion of the darkening layer.

29. A manufacturing method of a touch panel, comprising:
forming a conductive layer for forming a conductive pattern on a base;
depositing a darkening layer before and after forming the conductive layer;
patterning the conductive layer and the darkening layer, respectively or at the same time; and
inducing Galvanic corrosion of the patterned darkening layer.

30. The manufacturing method of a touch panel of claim 29, the Galvanic corrosion is performed during etching and stripping processes of the darkening layer.

* * * * *